(12) United States Patent
Borden

(10) Patent No.: US 7,718,347 B2
(45) Date of Patent: May 18, 2010

(54) METHOD FOR MAKING AN IMPROVED THIN FILM SOLAR CELL INTERCONNECT USING ETCH AND DEPOSITION PROCESS

(75) Inventor: Peter Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 816 days.

(21) Appl. No.: 11/394,723

(22) Filed: Mar. 31, 2006

(65) Prior Publication Data

US 2007/0238285 A1    Oct. 11, 2007

(51) Int. Cl.
*H01L 21/768* (2006.01)
*H01L 21/70* (2006.01)

(52) U.S. Cl. ............... 430/311; 430/320; 257/E21.587; 257/E21.026; 257/E21.027; 216/18; 438/618

(58) Field of Classification Search .................. None
See application file for complete search history.

(56) References Cited

U.S. PATENT DOCUMENTS

| | | | |
|---|---|---|---|
| 4,000,502 A | 12/1976 | Butler et al. | |
| 4,229,265 A * | 10/1980 | Kenworthy | 205/50 |
| 4,278,473 A * | 7/1981 | Borden | 136/249 |
| 4,388,346 A | 6/1983 | Bickler et al. | |
| 4,411,732 A | 10/1983 | Wotherspoon | |
| 4,416,052 A | 11/1983 | Stern | |
| 4,909,863 A | 3/1990 | Birkmire et al. | |
| 5,567,975 A | 10/1996 | Walsh et al. | |
| 5,581,346 A | 12/1996 | Sopori | |
| 6,300,593 B1 | 10/2001 | Powell | |
| 6,559,411 B2 | 5/2003 | Borgeson et al. | |
| 6,919,530 B2 | 7/2005 | Borgeson et al. | |
| 7,022,556 B1 * | 4/2006 | Adachi | 438/149 |

OTHER PUBLICATIONS

International Search Report issued Jul. 22, 2008 in PCT/US2007/065521.

* cited by examiner

*Primary Examiner*—Daborah Chacko Davis
(74) *Attorney, Agent, or Firm*—Pillsbury Winthrop Shaw Pittman

(57) ABSTRACT

The present invention provides a method of forming interconnects in a photovoltaic module. According to one aspect, a method according to the invention includes processing steps that are similar to those performed in conventional integrated circuit fabrication. For example, the method can include masks and etches to form isolation grooves between cells, and additional etches to form a conductive step adjacent to the grooves that can be used to form interconnects between cells. According to another aspect the method for forming the conductive step can be self-aligned, such as by positioning a mirror above the module and exposing photoresist from underneath the substrate at an angle one or more times, and etching to expose the conductive step. According to another aspect, the process can include steps to form grid lines in the module to improve current transport in the structure.

4 Claims, 7 Drawing Sheets

METHOD FOR MAKING AN IMPROVED THIN FILM SOLAR CELL INTERCONNECT USING ETCH AND DEPOSITION PROCESS

FIELD OF THE INVENTION

The present invention relates generally to photovoltaic devices, and more particularly to a system and method for making improved interconnects in thin-film photovoltaic devices.

BACKGROUND OF THE INVENTION

Thin film solar modules offer an attractive way to achieve low manufacturing cost with reasonable efficiency. These modules are made from a variety of materials, including amorphous silicon, amorphous silicon germanium, copper indium gallium selenide (CIGS), and cadmium telluride. A common feature of these solar modules is the deposition on a large area insulator such as a glass sheet.

Another common feature of these modules is the use of scribes and interconnects to divide the large area deposited layer into a number of cells and/or sub-cells. A top view of a typical module divided in this fashion is shown in FIG. 1. As shown in FIG. 1, a module 100 is divided into a plurality of cells 102 (i.e. stripes) that are series connected (e.g. electrically connected together in a horizontal direction in this drawing) via interconnects 104. The interconnects are typically formed in the module using scribes and conductors. However, it should be noted here that the length L of such modules 100 can be 1 meter or more. Meanwhile, the width of the interconnects (corresponding to the dimension W in FIG. 2), which typically run almost the entire length L of the module, are typically around 700-1000 µm, and the width of the cells (i.e. stripes) are typically about 1 cm. As will be understood by those of skill in the art, FIG. 1 is a simplified, not-to-scale drawing of a typical module, and that the module can further include other passive and active components not shown in FIG. 1 such as electrodes, protect diodes and terminals. Moreover, the module will typically also include external contacts and/or be environmentally encapsulated.

As is known, interconnects 104 are made to provide a high voltage, low current output that is less susceptible to series resistance losses. For example, a 1 m² panel at 12% efficiency would provide 120 watts of power. If the cell operating voltage is 0.6 volts, then the current is 200 amps. Since the ohmic loss is I²R (where I is the current and R the resistance), and since the thin conductive films have relatively high resistance, most of the power would be dissipated. However, if the module was divided into 300 stripes, for example, then the voltage would be 180 volts and the current 0.56 amps. The ohmic losses would be reduced by a factor of 89,000.

Co-pending application Ser. No. 11/245,620 (AMAT-10468), commonly owned by the present assignee, the contents of which are incorporated herein by reference, dramatically advanced the state of the art of forming interconnects for thin-film photovoltaic modules. One aspect of that invention included the use of a single laser scribe to form a cut that included a step structure to expose the base electrode. Another aspect of that invention was that the resulting interconnects could be much narrower than conventional interconnects, leading to more efficient module structures.

A process described in the co-pending application is shown in FIGS. 2A to 2E with reference to a portion of one interconnect region such as 106 in FIG. 1. In the first step shown in FIG. 2A, the entire conductor, semiconductor and contact stack 202-206 is deposited on the substrate 208, such as glass.

In one embodiment, layer 202 is a metal such as molybdenum or a TCO such as ZnO, layer 204 is a semiconductor such as CIGS, and layer 206 is a TCO such as ZnO. In some embodiments, the entire stack is about 2-3 µm thick.

In the next step shown in FIG. 2B, a scribe 210 is made to the bottom conductor 202. As shown in FIG. 2C, a second scribe 212 is made using a smaller cut to create an exposed conductive ledge 214. Both of these scribes 210 and 212 may be made using a laser or mechanical scribe, or a combination of both.

In one embodiment where the scribes are made at the same time, a laser beam is used that has a skewed intensity profile, in that it is more intense on the left side than the right (with respect to the orientation of the drawing). This causes the left side to cut deeper than the right, forming the ledge 214. In another embodiment, two laser sources are coupled into a single fiber. One is an infrared source such as Nd:YAG with a wavelength of 1064 nm, for example, that penetrates the stack because its photon energy is below the bandgap of the semiconductor. This preferentially cuts through the conductor 202. The second is a shorter wavelength source, for example doubled Nd:YAG and 532 nm that cuts through the semiconductor 204 (e.g. CIGS) but not conductor 202. The width of the second cut is on the order of 20 to 50 µm, and the total width W can be reduced to as low as 0.01 to 0.2 cm, much narrower than was previously possible.

As shown in FIG. 2D, following the scribes, an insulator 216 is deposited on one wall. In a preferred embodiment, the insulator 216 is deposited using the following self-alignment method. A photosensitive polymer such as a polyimide or photoresist is applied over the entire module using any of a number of well-known methods, such an ink-jet, a spray or roller. The polymer is exposed from the back side through the glass. This performs a self-aligned exposure within the groove (i.e. the conductor layer 202 blocks exposure of all the photoresist except the portion in the groove). Next the polymer is developed, leaving only a coating on the left wall (with respect to the orientation shown in the drawing) that was exposed through the groove.

Finally, as shown in FIG. 2E, a conductor 218 is deposited over the insulator 216 to connect the top of the left cell 220 to the bottom of right cell 222. This provides a series connection between the cells 220 and 222. The entire length of the cut (e.g. the length L of the cut in the module as shown in FIG. 1) can then be coated with insulator and conductor materials to form the interconnects.

While the method of the co-pending application provides acceptable results and much narrower interconnects than previously possible, it may suffer from certain drawbacks. For example, laser ablation as used in the steps discussed in connection with FIGS. 2B and 2C has poor selectivity, so there can exist a narrow process window in which the ablation stops at the underlying conductor on the right side while cutting through to glass on the left. Moreover, laser ablation may have low throughput for panels with a large number of narrow stripes, where several hundred cuts, each one or meter long, may be required. Still further, laser ablation can cause damage at the edge, especially when performed at high ablation rates.

Co-pending application Ser. No. 11/394,721, commonly owned by the present assignee, the contents of which are incorporated herein by reference, describes an alternate means to form the exposed conductive step. In one preferred embodiment, this was done using a single layer of photoresist and two exposures. One aspect of this embodiment was an exposure from the back side reflecting from a mirror above the substrate to create a self-aligned exposed region that can be etched to form the conductive step. However, once the grooved step was formed a number of additional process steps were required to insulate the sidewall and deposit a conductor. Moreover, U.S. Pat. No. 6,300,593, 6,559,411 and 6,919,530 all describe processes using laser scribing through thin film photovoltaic materials, and so exhibit certain of the drawbacks mentioned above. Although these references depict an insulator within isolation grooves, the particular method used to accomplish this insulation is not disclosed, and thus cannot serve to improve the processes of the co-pending application.

Therefore, it would desirable to overcome many of the shortcomings afflicting the above-described methods of forming interconnects in a thin-film photovoltaic device. The present invention aims at doing this, among other things.

SUMMARY OF THE INVENTION

The present invention provides a method of forming interconnects in a photovoltaic module. According to one aspect, a method according to the invention includes processing steps that are similar to those performed in conventional integrated circuit fabrication. For example, the method can include masks and etches to form isolation grooves between cells, and additional etches to form a conductive step adjacent to the grooves that can be used to form interconnects between cells. According to another aspect the method for forming the conductive step can be self-aligned, such as by positioning a mirror above the module and exposing photoresist from underneath the substrate at an angle one or more times, and etching to expose the conductive step. According to another aspect, the process can include steps to form grid lines in the module to improve current transport in the structure.

In furtherance of these and other objects, a method for forming an interconnect in a thin film photovoltaic module in accordance with the invention includes preparing a stack of photovoltaic module layers on a top surface of a substrate, forming an isolation groove having first and second substantially parallel edges completely through the stack, while leaving photoresist on top of the stack adjacent the first and second edges of the groove, exposing areas of the photoresist adjacent to the first edge of the groove, and etching through one or more layers of the stack via the exposed photoresist to form a contact step adjacent the first edge of the groove.

In certain embodiments, the method further includes forming a connector between a top conductor of the stack adjacent the second edge of the groove and the contact step. In certain other embodiments, the step of forming a connector includes depositing a conductive material at an angle after forming the contact step, thereby shadowing a wall of the stack adjacent to the contact step from deposition. In certain other embodiments, the step of forming the connector includes applying an additional layer of photoresist after forming the contact step, illuminating the substrate from underneath and through the groove, thereby exposing the additional photoresist over the groove and adjacent the first and second edges of the groove, removing the exposed additional photoresist, while leaving un-exposed additional photoresist, depositing a conductive material on the substrate, and removing the un-exposed additional photoresist, thereby leaving conductive material that comprises the connector.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general the present invention relates to methods of forming interconnects in thin-film photovoltaic devices that use processes similar to conventional IC fabrication processes. Such processes do not require or include laser ablation, and so many of the disadvantages associated with laser ablation can be avoided. Moreover, the present invention leverages certain self-alignment and scalability advantages inherent in using IC fabrication processes.

Figure 1:
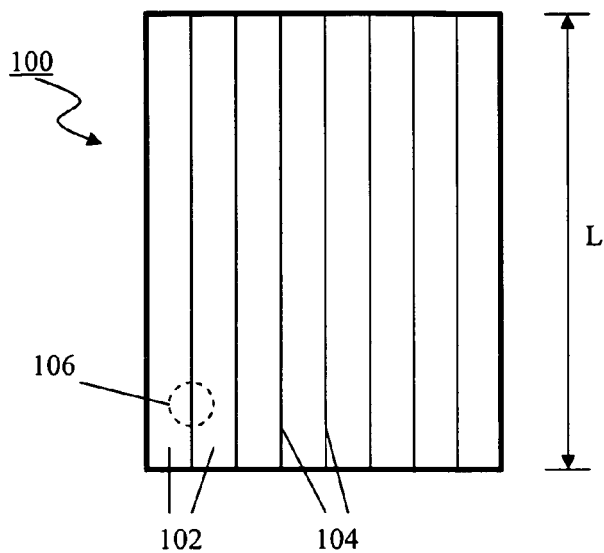
FIG. 1 is a top view of a conventional module of thin film photovoltaic cells separated by interconnects.
Figure 2:
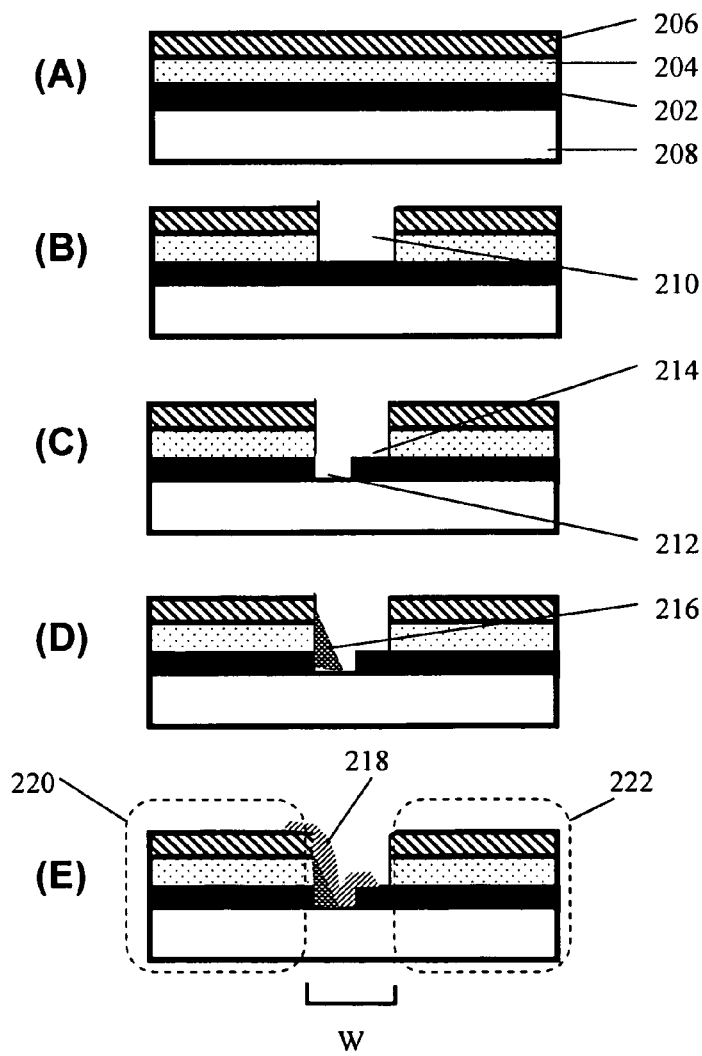
FIGS. 2A-E show a process of forming an interconnect between thin film photovoltaic cells according to a co-pending application.
Figure 3:
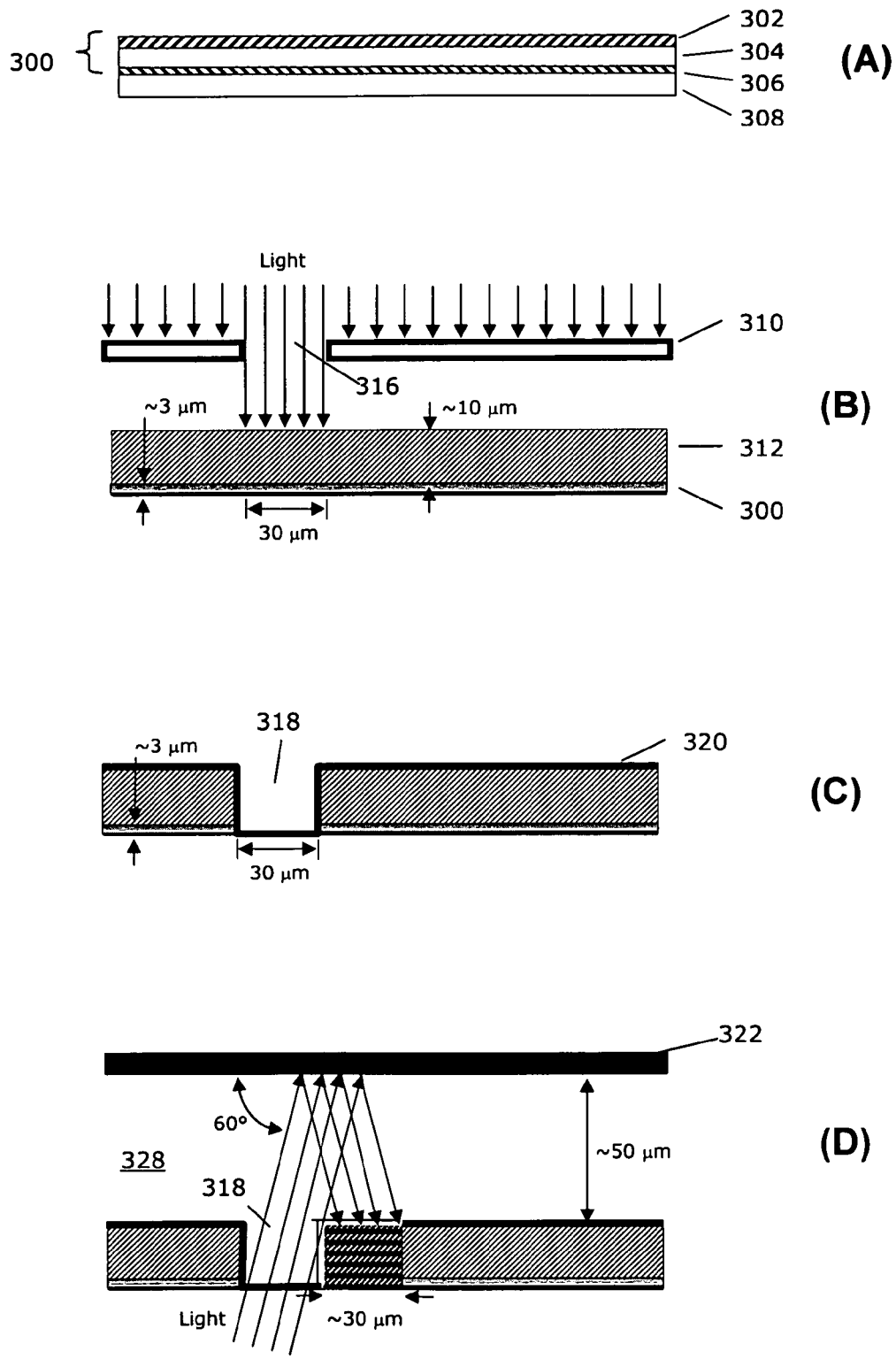
FIGS. 3A-G show a process of forming an interconnect between thin film photovoltaic cells according to one preferred embodiment of the invention.
Figure 3:
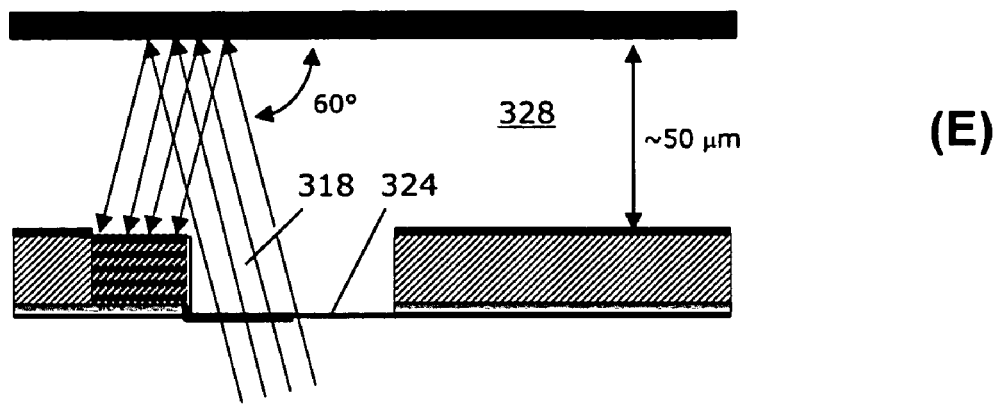
Figure 3:
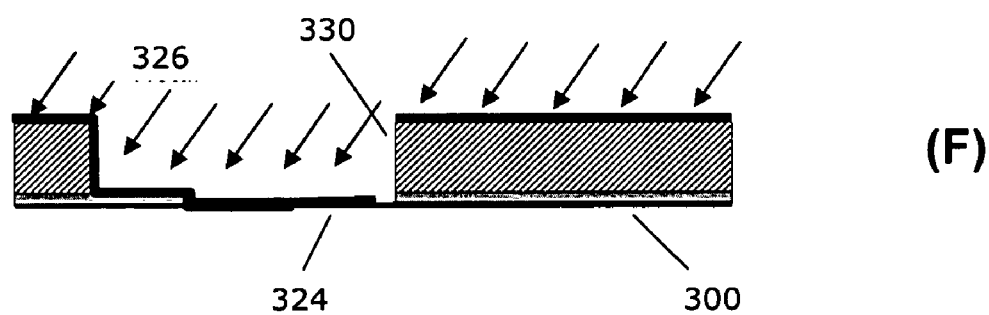
Figure 3:
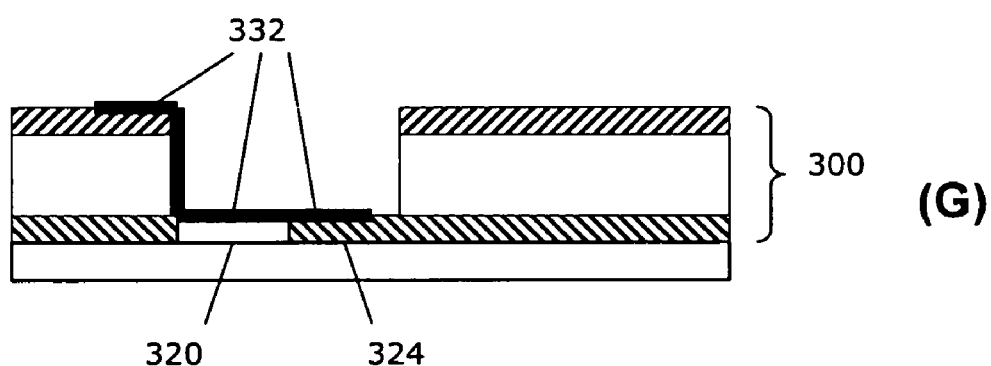

In FIG. 3C, the resist is developed and isolation cuts 318 are etched to the glass using either a wet or dry etch. In one example of a staged wet etch process, a HCl or $CH_3COOH$ solution can be used to etch through the ZnO layer, then a $H_2SO_4+HNO_3$ process can be used to etch through the CIGS layer, then a $H_3PO_4+CH_3COOH+HNO_3$ (commonly called PAN etch) process can be used to etch through the Mo layer. It should be noted that the CIGS layer etch process is unique and novel in and of itself, and various example methods of performing this or alternative CIGS etch processes are described in more detail in co-pending application Ser. No. 11/395,080, the contents of which are incorporated herein by reference. Moreover, an aspect of this invention as will be explained in more detail below, is that isolation cut 318 acts as an aperture of a mask for subsequent self-aligned processing. Following the etch to the glass, an insulator 320 is deposited using, for example, a plasma process with carbon and fluorine gasses to create a $CF_4$ compound. Although an etch process is preferred, alternative embodiments may use a mechanical or laser scribe process.

As shown in FIG. 3A, the process flow in this embodiment begins with a stack 300 of starting material on a substrate 308 such as a 3 mm thick sheet of glass. In this embodiment, stack 300 includes a 0.1 μm layer 306 corresponding to the opaque metal electrode—typically molybdenum—in contact with the glass substrate 308, and a 1 μm layer 302 corresponding to the transparent electrode—typically aluminum doped ZnO—on the top surface. The process can also be used with other types of thin film modules, such as α:Si, μC:Si, and micromorph, in which case the transparent electrode may be in contact with the glass and the metal counter-electrode is on the top. For this process flow, the semiconducting layer 304 is a 2 μm layer of CIGS under a 0.07 μm buffer layer of CdS, but any other appropriate material including CIS, α:Si, μC:Si, CdTe, or stacks of multiple materials, could also be used, and the buffer layer need not be included.

It should be noted that an additional layer of material such as $SiO_2$ can be added to the top of the stack to protect the ZnO. Other protection layer materials are possible, such as BARC or BCB.

The first step in the process flow is to make an isolation cut to the glass. In one preferred embodiment, this is done with an etch process rather than laser or mechanical scribes, as will be described in more detail herein. For example, in this embodiment shown in FIG. 3B, a layer 312 of photoresist is applied to the module, using a spray, dip or roll-on process. The thickness may be 1-10 μm. 30 μm wide lines are exposed in the photoresist using a mask 310 with a corresponding aperture 316 suspended about 10 μm above (shown) or in contact with the substrate.

In FIG. 3C, the resist is developed and isolation cuts 318 are etched to the glass using either a wet or dry etch. In one example staged wet etch process, a HCl or $CH_3COOH$ solution can be used to etch through the ZnO layer, then a $H_2SO_4$+$HNO_3$ process can be used to etch through the CIGS layer, then a $H_3PO_4$+$CH_3COOH$+$HNO_3$ (commonly called PAN etch) process can be used to etch through the Mo layer. It should be noted that the CIGS layer etch process is unique and novel in and of itself, and various example methods of performing this or alternative CIGS etch processes are described in more detail in co-pending application Ser. No. 11/395,080, the contents of which are incorporated herein by reference. Moreover, an aspect of this invention as will be explained in more detail below, is that isolation cut 318 acts as an aperture of a mask for subsequent self-aligned processing. Following the etch to the glass, an insulator 320 is deposited using, for example, a plasma process with carbon and fluorine gasses to create a $CF_4$ compound. Although an etch process is preferred, alternative embodiments may use a mechanical or laser scribe process.

FIG. 3D illustrates a next step which begins a process of forming a conductive step or contact step according to one preferred embodiment. In accordance with techniques described in more detail in co-pending application Ser. No. 11/394,721, a reflector or mirror 322 is placed in close proximity to the top surface (e.g. 50 μm) and the illumination is incident from the under side of the glass substrate 308 at an angle. The light reflects from the mirror and exposes a region of photoresist adjacent to the already formed scribe 318. Therefore, this exposure is self-aligned to the existing scribe, and creates a step with a width according to formulae described in the co-pending application.

It is preferable to hold the spacing between the mirror and the substrate constant. In one embodiment, the mirror has soft spacers that provide a fixed distance spacing without damaging the substrate. In another embodiment, a transparent film 328 is spread over the surface of the substrate, so that the exposure light reflects from a top surface of the film. For example, the film 328 can be clear mylar and the top surface can have a reflective coating 322 comprising aluminum, for example, to enhance reflection from the top surface. In another alternative, clear mylar film 328 without a reflective coating can be used to establish a uniform spacer for a separate reflector or mirror 322 placed thereon.

Following exposure and development, an etch is performed to form the conductive step 324. This may be done with either a dry etch or wet etch, or a combination of both. As in the previous etch processes to form groove 318, the etch chemistry may be changed to selectively progress through each layer of the cell stack. In some embodiments, the etch is stopped when the bottom conductor is reached (molybdenum in the case of CIGS or ZnO in the case of α:Si or μC:Si). In other cases, the etch may be stopped in the semiconductor layer. For example, in α:Si or μC:Si the semiconductor is heavily doped near the bottom, and contact to this heavily doped region is acceptable.

As shown in FIG. 3E, exposure through groove 318 is repeated with the light incident from the opposite direction to clear photoresist from an adjacent region left of the groove 318 with respect to the orientation in the drawing. The development and removal of the photoresist in this region from the top of stack 300 may be followed with a cleaning step to ensure that the surface of stack 300 will provide good contact to the interconnect metal.

As shown in FIG. 3F, metal 326 is now deposited using a directional process such as evaporation. For example, Al is deposited using vapor deposition at an angle of about 45°. The remaining photoresist 312 acts as a shadow mask, so that the metal is only deposited on the top of the left cell (with respect to the orientation of the drawing), down the left sidewall, and onto the conductive step 324. The right sidewall 330 is not coated because of the shadow masking.

The final structure after resist removal is shown in FIG. 3G. As shown in FIG. 3G, metal interconnect 332 runs from the top of the cell on the left of isolation groove 318 (with respect to the drawing) to the conductive step 324 of the cell to the right. Insulator 320 remains in groove 318 and thus provides further insulation between the cells.

Note that in the step shown in FIG. 3E it is possible to do a second exposure from the top through a shadow mask to form grid lines. In this case, the mask may be aligned visually. For example, light may be shown through the substrate to highlight the existing grid lines. In one embodiment, the mask is aligned to the grid lines by maximizing transmission of light through the mask, which has openings that overlay the groove line pattern. This maximum is achieved when the mask exactly overlays the groove pattern. In one example, the grid lines cut through the top ZnO/TCO layer in a substantially perpendicular direction of the grooves 318, completely from one edge of the cell to the other in each stripe, thus reducing conductance in the cells. The grid lines can be separated by about 3 mm in one example.

A second example process embodiment will be described below in connection with FIGS. 4A-4G.

The process steps in FIGS. 4A and 4B for forming an isolation groove in a stack 400 can be implemented substantially as explained in connection with FIGS. 3A and 3B. As in the previous embodiment, stack 400 includes layer 406 corresponding to the opaque metal electrode—typically molybdenum—in contact with the glass substrate 408, and layer 402 corresponding to the transparent electrode—typically aluminum doped ZnO—on the top surface. Semiconducting layer 404 can be any appropriate material: CIGS, CIS, α:Si, µC:Si, CdTe, or stacks of multiple materials. As with the previous embodiment, an additional SiO2 layer can be added to the top of the stack to protect the ZnO. Other protection layer materials are possible, such as BARC or BCB.

Figure 4:
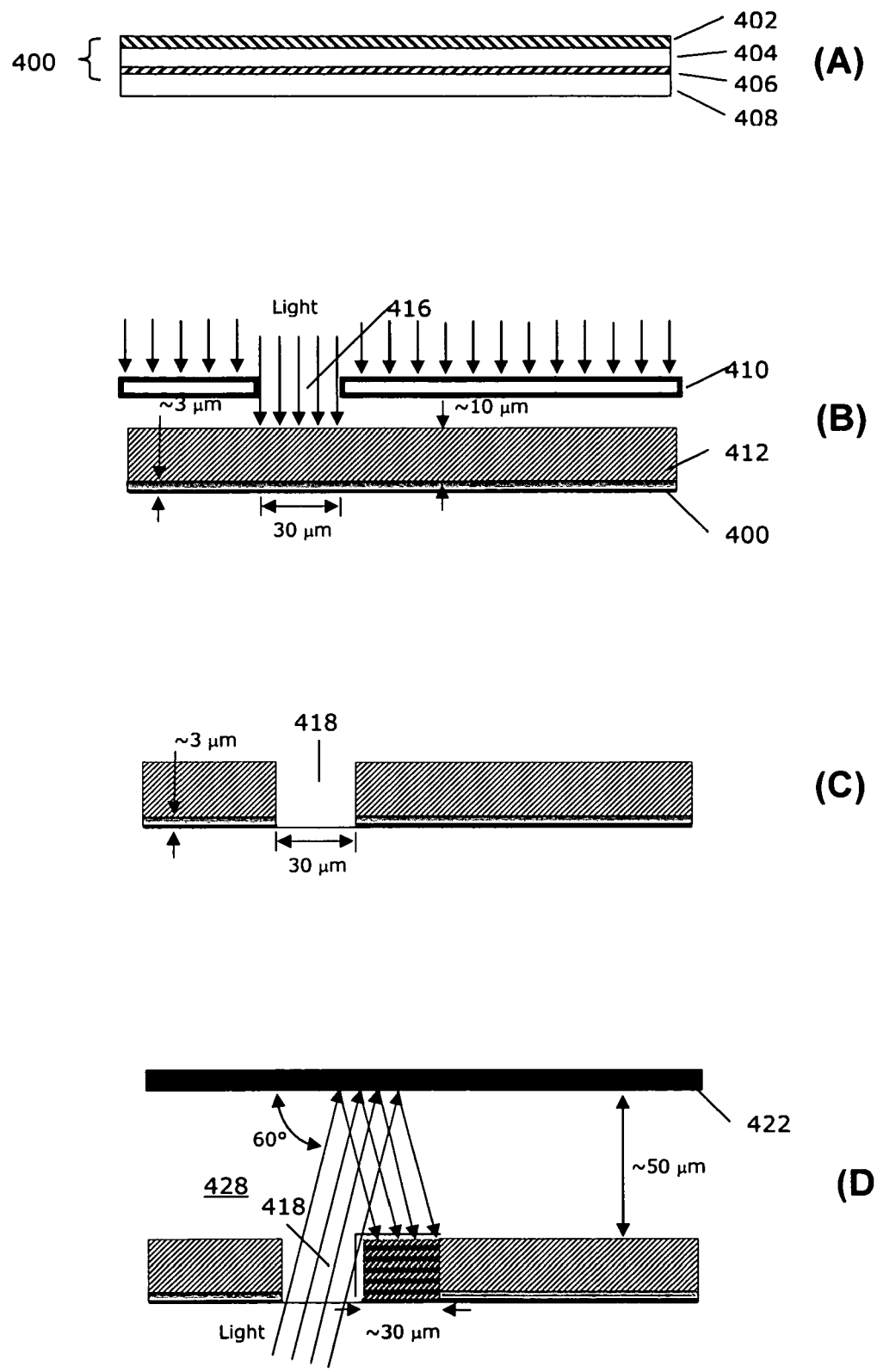
FIGS. 4A-I show a process of forming an interconnect between thin film photovoltaic cells according to another preferred embodiment of the invention.
Figure 4:
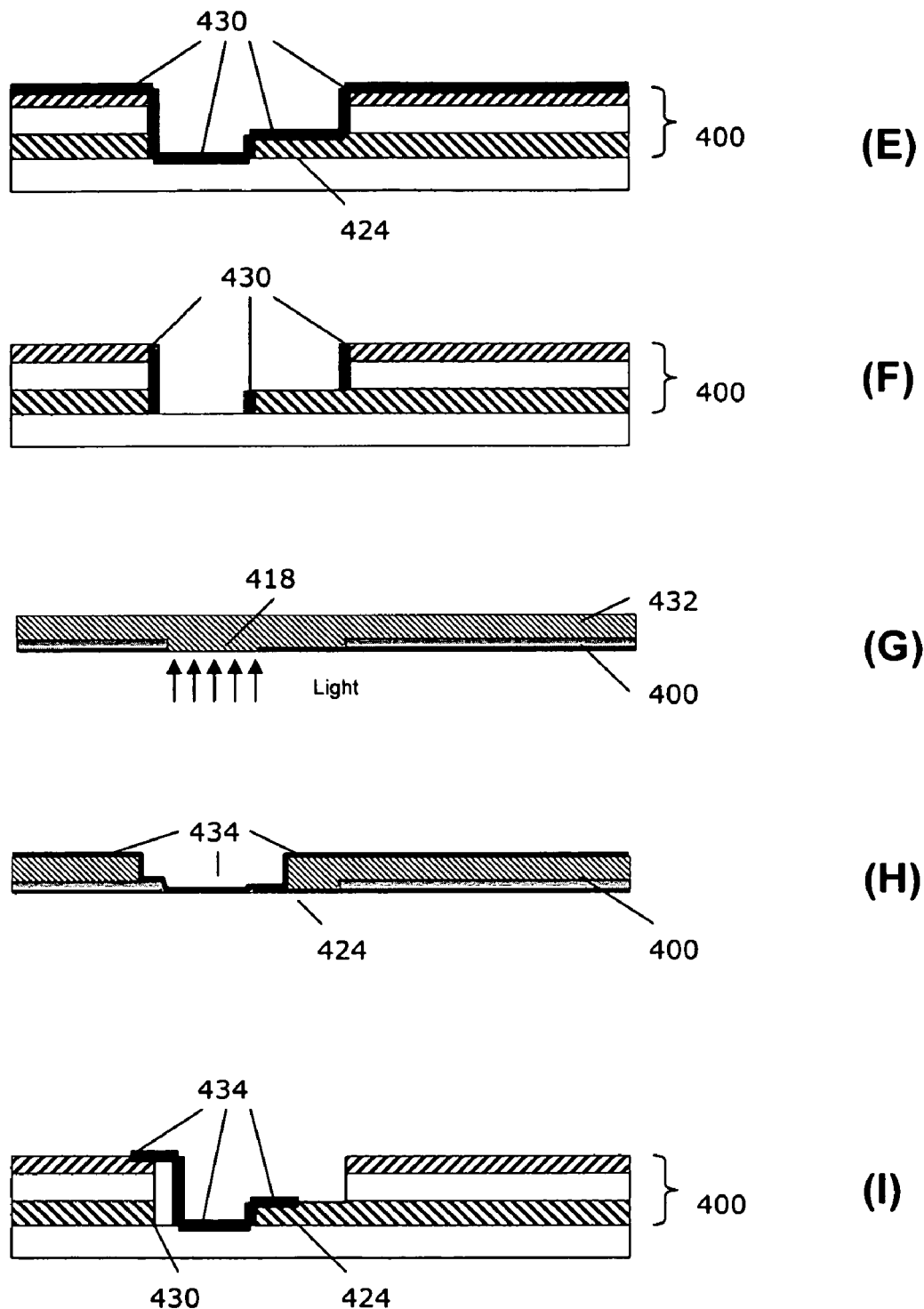

In contrast with the previous embodiment, however, an insulator is not deposited after the process in FIG. 4B is completed. Instead, the conductive step is formed using angled lithography, as will be explained in more detail below.

More particularly, in FIGS. 4B and 4C, the portions of photoresist 412 that have been exposed through mask 410 having aperture 416 are developed and etched down to the substrate to form groove 418. The multi-step etching process described in the previous embodiment can be used where the process is adjusted for each layer. However, it should be noted that ZnO undercut could be a problem in either embodiment. Accordingly, a postbake can be performed after the ZnO etch to sag the resist over the ZnO.

Next, as shown in FIG. 4D, similar to the previous embodiment, light incident at an angle through groove 418 is reflected off mirror 422 (e.g. a reflector on surface of mylar film 428) to expose an adjacent section of photoresist 412.

In FIG. 4E, the photoresist is then removed, and an etch down to metal layer 406 is performed, leaving conductive step 424. A multi-stage etch down to the metal layer 406 can be performed for this etch as in the previous embodiment. Next, a thin (e.g. 0.1 µm thick) insulator 430 is applied. This could be a polymer film, a CVD dielectric such as silicon dioxide or nitride, or any of a number of other films. Analogous to a spacer process used to coat the side of a gate in a MOSFET process, the insulator is etched from the top using a wet or dry etch process. This leaves an insulator residue on the vertical walls, providing insulation, as shown in FIG. 4F.

Photoresist layer 432 is again applied to the structure and exposed from the backside through groove 418 as shown in FIG. 4G. For this step, a 2 µm layer of lift-off resist such as ProLift 100, trademarked and available from Brewer Science, could be used for layer 432, as will become more apparent from below. Moreover, in this case, the light can be incident over a broad range of angles, thereby exposing the resist over the opening and adjacent resist, as shown in FIGS. 4G and 4H. This can be done, for example, by illuminating from beneath with a non-collimated light source, such as a mercury vapor lamp, as the substrate rides on a conveyor track over the lamp. In some cases it may be desirable to overexpose the resist to increase the lateral range of the exposure. The effect of this wide opening is to clear resist from the top of the cell to the left of the groove 418 (with respect to the orientation in the drawing) and the top of the left edge of the conductive step 424.

Next, as shown in FIG. 4H, metal 434 such as a 0.3 µm layer of Al is deposited over the substrate, and finally as shown in FIG. 4I, the remaining photoresist 432 is stripped to lift off the metal from the regions covered with photoresist. This leaves metal connecting the top of the left cell to the bottom of the right, as shown in FIG. 4I. It is preferred to use sputtering for deposition of the conductor, as this is more economical. This forces use of the lift-off resist described above in order to ensure a break in the coating at the resist boundary so that a clean lift-off is obtained. However, in some embodiments, metal evaporation is used.

The final structure is shown in FIG. 4I. As shown in FIG. 4I, in this example, insulator 430 remains on the wall of the cell to the left of groove 418 (with respect to the orientation in the drawings), thus preventing the metal from shorting the cell at the exposed edge.

Another possible embodiment is shown in FIGS. 5A to 5I.

The process steps in FIGS. 5A to 5C for forming an isolation groove in a stack 500 can be implemented substantially as explained in connection with FIGS. 4A to 4C. In this embodiment, stack 500 includes layer 504 corresponding to the opaque metal electrode—typically molybdenum—in contact with the glass substrate 506. In this embodiment, however, at this stage of the process there is no layer corresponding to the transparent electrode on the top surface. Semiconducting layer 502 could be any appropriate material: CIGS, CIS, α:Si, µC:Si, CdTe, or stacks of multiple materials as described above.

Figure 5:
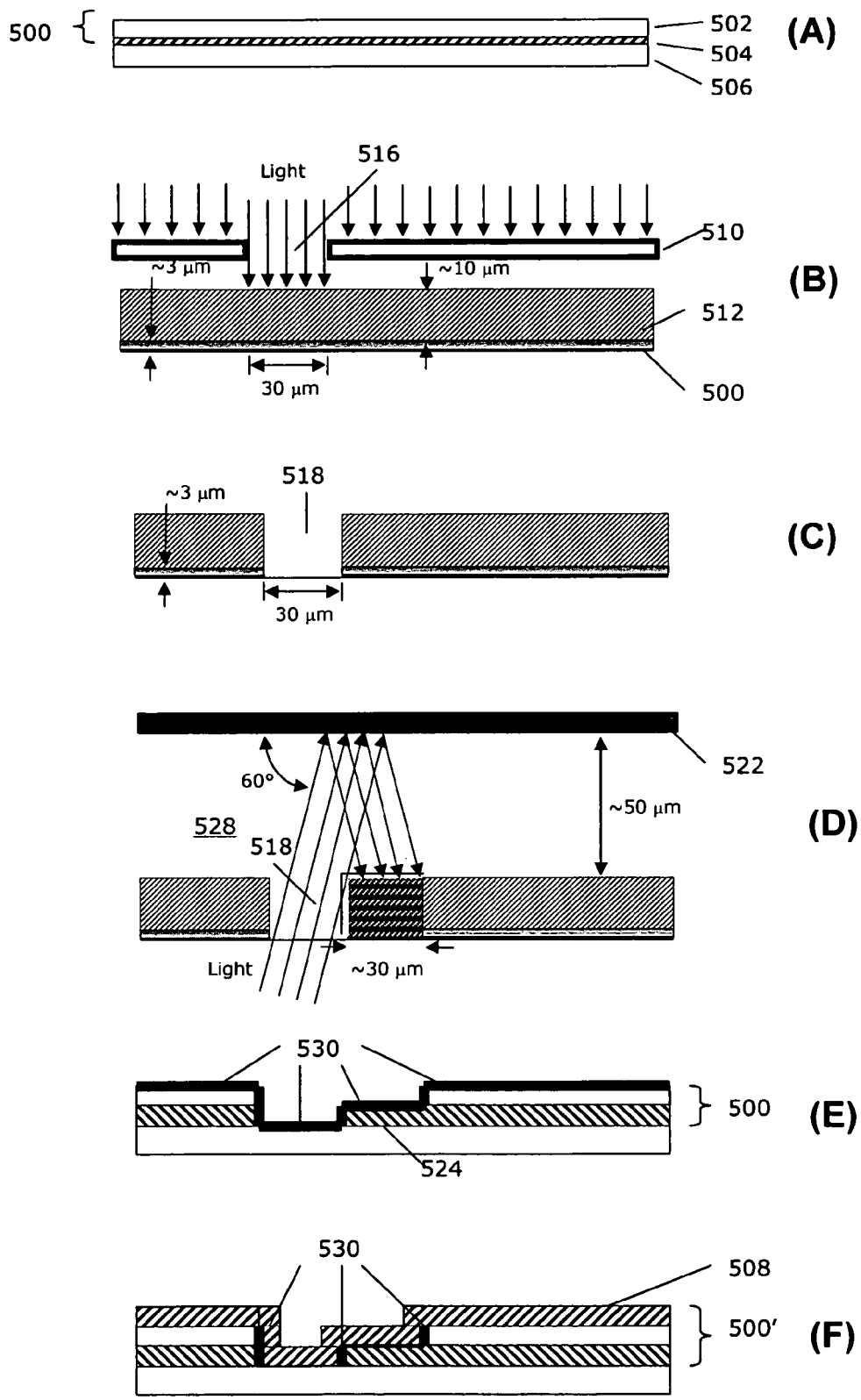
FIGS. 5A-J show a process of forming an interconnect between thin film photovoltaic cells according to another preferred embodiment of the invention.
Figure 5:
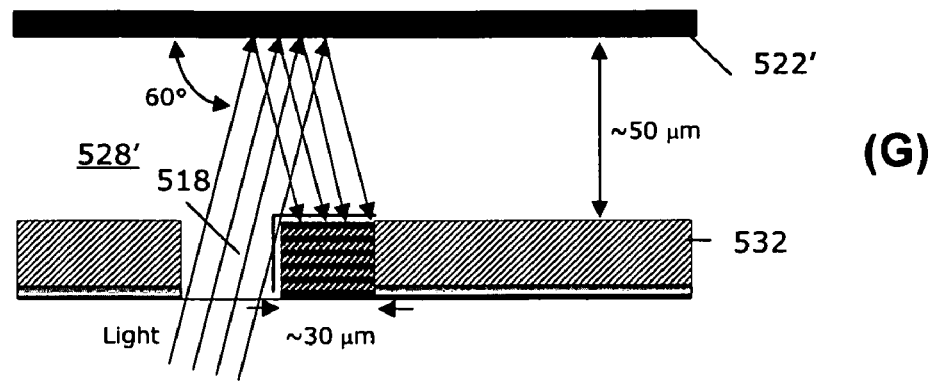
Figure 5:
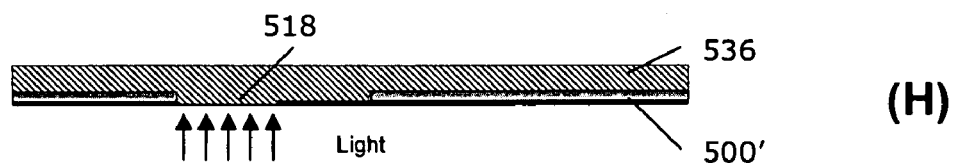
Figure 5:
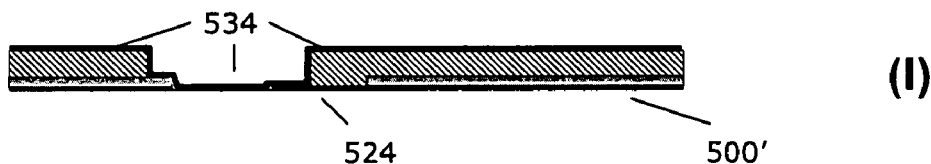
Figure 5:
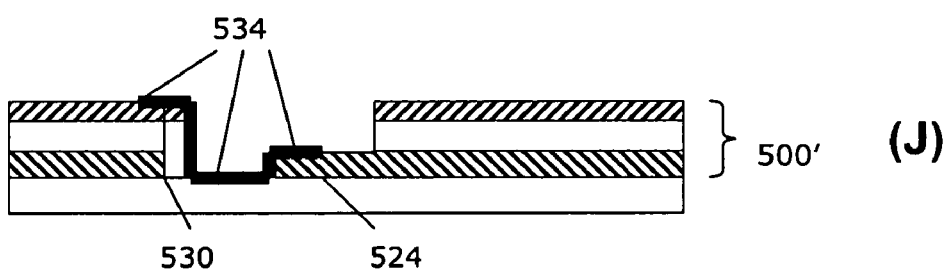

In FIGS. 5B and 5C, the portions of photoresist 512 that have been exposed through mask 510 having aperture 516 are developed and etched down to the substrate to form groove 518. Next, as shown in FIG. 5D, similar to the previous embodiments, light incident at an angle through groove 518 is reflected off mirror 522 (e.g. a reflector coated or resting on top of a clear mylar film 528) to expose an adjacent section of photoresist 512.

Further similar to the previous embodiment, in FIG. 5E, the photoresist is then removed, and an etch through the semiconductor layer 502 is performed leaving conductive step 524. Next, a thin insulator 530 is applied. This could be a polymer film, a CVD dielectric such as silicon dioxide or nitride, or any of a number of other films. Analogous to a spacer process used to coat the side of a gate in a MOSFET process, the insulator is etched from the top using a wet or dry etch process. This leaves an insulator residue 530 on the vertical walls, providing insulation, as shown in FIG. 5F. As further shown in FIG. 5F, a 0.7 µm layer 508 of a TCO such as ZnO is then deposited.

Photoresist layer 532 (e.g. a positive photoresist such as Shipley 3612) is next applied to the structure and exposed at an angle from the backside through groove 518 as shown in FIG. 5G. The photoresist is then developed and etched down through the underlying ZnO and down to conductive step 524. The remaining photoresist is then stripped. It should be noted that this step may require two exposures, one to clear the hole 518 followed by the angled exposure. In an alternate process (not self-aligned), the original mask is shifted and the ZnO is stripped over the right edge, with the remaining ZnO forming a connection between the top of the left cell and the conducting ledge (with respect to the orientation of the drawing).

As shown in FIG. 5H, a next step includes applying a new photoresist layer 536 (e.g. a positive photoresist such as Shipley 3612 on top of a layer of lift-off resist such as ProLift 100) and performing an additional exposure through groove 518. In this case, the light is incident over a broad range of angles, for example by illuminating using a non-collimated light source as described above, thereby exposing the resist over the opening and adjacent resist, as shown in FIGS. 5H and 5I. In some cases it may be desirable to overexpose the resist to increase the lateral range of the exposure. The effect of this wide opening is to clear resist from the top of the cell to the left of the groove 518 (with respect to the orientation in the drawing) and the top of the left edge of the conductive step 524.

Finally, as shown in FIG. 5I, a metal layer 534 such as a 0.3 µm layer of aluminum is deposited over the substrate and next as shown in FIG. 5J, the photoresist 536 is stripped to lift off the metal from the regions covered with photoresist. This leaves metal connecting the top of the left cell to the bottom of the right, as shown in FIG. 5J. It is preferred to use sputtering for deposition of the conductor, as this is more economical. This forces use of the lift-off resist described above in order to ensure a break in the coating at the resist boundary so that a clean lift-off is obtained. However, in some embodiments, metal evaporation is used.

The final structure is shown in FIG. 5J. As shown in FIG. 5J, a portion of insulator 530 remains on the sidewall of the cell to the left of the groove 518 with respect to the orientation of the drawing, thus preventing the conductor from shorting the cell. Insulators on the sidewall can also protect the exposed junction edge and provide passivation at the exposed edge.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for processing a thin film photovoltaic module comprising:
    preparing a stack of photovoltaic module layers on a top surface of a substrate;
    coating the stack with a first photoresist;
    defining an isolation groove pattern in the first photoresist;
    etching completely through the stack, using the defined isolation groove pattern, to form an isolation groove having first and second substantially parallel edges;
    defining a contact step pattern in the first photoresist;
    etching though one or more layers of the stack, using the defined contact step pattern, to form a contact step adjacent the first edge of the groove;
    forming an insulator on the second edge of the isolation groove;
    coating the stack, insulator and contact step with a second photoresist;
    defining a contact groove pattern in the second photoresist, the contact groove pattern overlying the isolation groove and extending laterally over a portion of the contact step, the insulator, and a portion of the stack adjacent the second edge of the isolation groove;
    creating a contact groove by clearing portions of the second photoresist corresponding to the contact groove pattern;
    forming a connector by depositing metal in the contact groove; and
    removing remaining portions of the second photoresist.

2. A method according to claim 1, wherein one of the layers in the stack is a semiconductor layer comprising CiGS.

3. A method for processing a thin film photovoltaic module comprising:
    preparing a stack of photovoltaic module layers on a top surface of a substrate;
    coating the stack with a first photoresist;
    defining an isolation groove pattern in the first photoresist;
    etching completely through the stack, using the defined isolation groove pattern, to form an isolation groove having first and second substantially parallel edges;
    defining a contact step pattern in the first photoresist;
    etching through one or more layers of the stack, using the defined contact step pattern, to form a contact step adjacent the first edge of the groove;
    forming an insulator on the second edge of the isolation groove;
    coating the stack, insulator and contact step with a transparent conductive oxide;
    further coating the stack, insulator and contact step with a second photoresist over the transparent conductive oxide;
    defining a second contact step pattern in the second photoresist, the second contact step pattern substantially overlying the contact step;
    etching completely through the transparent conductive oxide, using the defined second contact step pattern, to substantially remove the transparent conductive oxide from the contact step;
    removing all remaining portions of the second photoresist;
    coating the stack, insulator and contact step with a third photoresist over the transparent conductive oxide;
    defining a contact groove pattern in the third photoresist, the contact groove pattern overlying the isolation groove and extending laterally over a portion of the contact step, the insulator, and a portion of the stack adjacent the second edge of the isolation groove;
    creating a contact groove by clearing portions of the third photoresist corresponding to the contact groove pattern;
    forming a connector by depositing metal in the contact groove; and
    removing remaining portions of the third photoresist.

4. A method according to claim 3, wherein one of the layers in the stack is a semiconductor layer comprising CIGS, and another layer in the stack is a metal layer comprising molybdenum.

* * * * *

UNITED STATES PATENT AND TRADEMARK OFFICE
CERTIFICATE OF CORRECTION

PATENT NO. : 7,718,347 B2
APPLICATION NO. : 11/394723
DATED : May 18, 2010
INVENTOR(S) : Borden It is certified that error appears in the above-identified patent and that said Letters Patent is hereby corrected as shown below:

IN THE TITLE

Title page, item (54) and col. 1, line 3, delete "... PROCESS" and insert -- ...PROCESSES --, therefor.

In Columns 4-5, Lines 51-67 & 1-3, delete "In FIG. 3C,......scribe process." and insert -- An example embodiment of a process flow for the formation of an interconnect including forming a contact step between cells in a thin film photovoltaic module according to the invention is shown in FIGS. 3A-3G. It should be noted that the figures are not to scale, and that the relative dimensions of different layers and elements shown in certain process steps are exaggerated or diminished for clarifying certain aspects of the invention. Although example dimensions of various layers and features will be specified in the descriptions where appropriate, the figures are intended for illumination rather than limitation. --, therefor.

In Column 9, Line 29, in Claim 1, delete "though" and insert -- through --, therefor.

In Column 9, Line 47, in Claim 2, delete "CiGS." and insert -- CIGS. --, therefor.

Signed and Sealed this
Tenth Day of April, 2012

David J. Kappos
*Director of the United States Patent and Trademark Office*